(12) United States Patent
Nojima

(10) Patent No.: US 6,246,634 B1
(45) Date of Patent: Jun. 12, 2001

(54) INTEGRATED MEMORY CIRCUIT HAVING A FLASH MEMORY ARRAY AND AT LEAST ONE SRAM MEMORY ARRAY WITH INTERNAL ADDRESS AND DATA BUS FOR TRANSFER OF SIGNALS THEREBETWEEN

(75) Inventor: Isao Nojima, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/562,490

(22) Filed: May 1, 2000

(51) Int. Cl.$^7$ ..................................................... G11C 8/00
(52) U.S. Cl. ................................. 365/230.08; 365/185.08
(58) Field of Search ........................... 365/185.08, 230.08

(56) References Cited

U.S. PATENT DOCUMENTS 5,590,073 * 12/1996 Arakawa et al. ................ 365/185.08

OTHER PUBLICATIONS

See Specification of Application. Specifically, p. 2 second paragraph.

* cited by examiner

*Primary Examiner*—David Nelms
(74) *Attorney, Agent, or Firm*—Gray Cary Ware & Freidenrich LLP

(57) ABSTRACT

An integrated memory circuit has two flash memory arrays and at least one SRAM memory array. The three memory arrays are interconnected by an external address bus and data bus to a main control decoder sequencer which interfaces with the external environment. In addition, the flash and SRAM memory arrays are connected by an internal address and data bus. Through the use of modified software data protection scheme, erase and programming of one flash memory array can occur simultaneously with the reading or writing of data from the SRAM array or the reading of data from the other flash memory array. In addition, data transfer between one flash memory array and the SRAM memory array can occur simultaneously while reading of data occurs from the other flash memory array.

12 Claims, 2 Drawing Sheets

INTEGRATED MEMORY CIRCUIT HAVING A FLASH MEMORY ARRAY AND AT LEAST ONE SRAM MEMORY ARRAY WITH INTERNAL ADDRESS AND DATA BUS FOR TRANSFER OF SIGNALS THEREBETWEEN

TECHNICAL FIELD

The present invention relates to an integrated memory circuit having a plurality of flash memory arrays and at least one SRAM memory array and more particularly with the integrated memory circuit having an internal data and address bus to transfer signals between the memory arrays and an external data and address bus to receive and transfer signals from the memory arrays to external circuitry to the memory circuit.

BACKGROUND OF THE INVENTION

SRAM memory arrays are well known in the art. They are characterized by a fast write time and a fast read time. However, they suffer from the disadvantage of being volatile and low density. Flash memory arrays are also well known in the art. They offer the advantage of high density as well as non-volatility. However, they suffer from the disadvantage of low erase and programming speed as well as low read speed. Heretofore, the prior art teaches the use of an SRAM memory array having as many storage locations as a flash memory array to "shadow" the memory array. Data would be stored to and read from the SRAM memory array. During the time that the memory array is not being accessed, the contents of the SRAM memory array would be transferred to the accompanying flash memory array for long-term non-volatile storage. It should be recognized, however, that in such an arrangement, should access be required from the SRAM memory array during the time that it is transferring its contents to the flash memory array, the entire memory circuit would not be accessible by the external environment. In such an event, the memory circuit would be busy.

Further, another disadvantage of this prior art memory device is that a large amount of memory is devoted to the SRAM which is low density since there has to be as many SRAM memory cells as there are flash memory cells. Accordingly, it is desirable to reduce the number of SRAM memory cells and yet at the same time provide higher periods of accessibility for the entire memory circuit.

SUMMARY OF THE INVENTION

An integrated memory circuit comprises a first array of non-volatile memory cells and a second array of volatile memory cells. A first address bus and a first data bus carries a first address signal and a first data signal, respectively, from sources external to the circuit to and from the circuit. The memory circuit also has a second address bus and a second data bus for carrying a second address signal and a second data signal, respectively, which are internal to the circuit. Each of the first and second arrays of memory cells further comprises an access circuit for connecting the array of memory cells to the first address bus or the second address bus and to connect the array of memory cells to the first data bus or the second data bus. Finally, the integrated memory circuit comprises a control circuit which is responsive to data signals supplied on said first data bus and to a certain address signal supplied on the first address bus for transferring data from said first array of non-volatile memory cells to said second array of volatile memory cells along said second data bus.

DETAILED DESCRIPTION OF THE DRAWINGS

Figure 1:
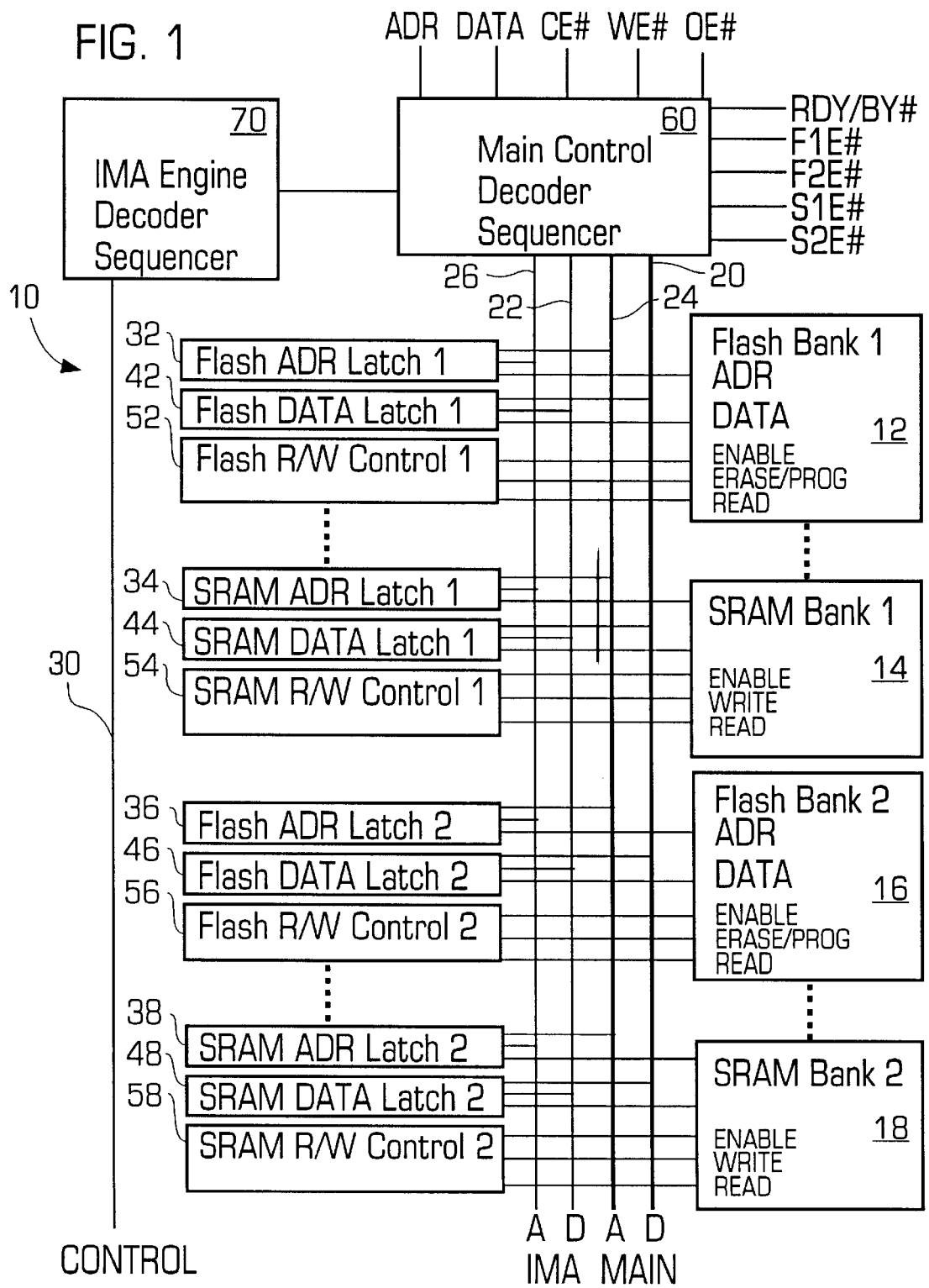
FIG. 1 is a schematic block level diagram of a first embodiment of an integrated memory circuit of the present invention.

Referring to FIG. 1 there is shown a schematic block level diagram of one embodiment of an integrated memory circuit 10 of the present invention. The integrated memory circuit 10 is constructed of a single semiconductor substrate in which the various circuit components as described herein are manufactured. The memory circuit 10 in the embodiment shown in FIG. 1 comprises a first array 12 of flash or non-volatile memory cells, a second array 16 of flash or non-volatile memory cells, a third array 14 of volatile or SRAM memory cells, and a fourth array 18 of volatile or SRAM memory cells. Although two volatile SRAM memory cells 14 and 18 are shown, the invention need not be practiced with two SRAM memory arrays 14 and 18. Because of the speed of reading and writing to and from an SRAM memory cell, a single SRAM memory array, either dual port or single port, can be used in place of the third and fourth memory arrays 14 and 18.

Each of the first, second, third and fourth memory arrays, 12, 16, 14, and 18, respectively has a port to receive an address signal and a port to receive data signals or to provide data signals. In the preferred embodiment, the first and second flash memory arrays 12 and 16 are of the size 4 Mbits and 4 Mbits. However, it will be understood that the present invention is not limited to any particular size to the memory arrays 12 and 16. Also in the preferred embodiment, the size of the third and fourth SRAM memory arrays 14 and 18 is preferably of 1 Mbit. Again, the invention is no so limited to this size.

Each of the first, second, third and fourth memory arrays, 12, 16, 14 and 18 respectively, has its address port connected to an address latch: 32, 36, 34, and 38 respectively. The address latch 32, 36, 34, and 38, is connected respectively to a first address bus 24 and to a second address bus 26. The address latch (32, 36, 34, and 38) receives the address signals from either the address bus 24 or 26 and stores it in the latch and then provides the stored address signal to the address port of the first, second, third, and fourth memory arrays 12, 16, 14, and 18 respectively. Thus, the address signals from the first or second address bus 24 and 26 is available through the address latch (32, 36, 34, and 38) to the memory arrays (12, 16, 14, and 18, respectively).

The memory circuit 10 also comprises a plurality of data latches 42, 46, 44 and 48 each of which is associated with first, second, third and fourth memory arrays (12, 14, 16, and 18, respectively). The data latch (42, 46, 44 and 48) stores the data signals that are received from a first or a second data bus 20 and 22 respectively, and provides the data signals stored to the data port of the memory array (12, 16, 14, and 18 respectively). In addition, the data latch (42, 46, 44, and 48) supplies the data signals to the first or the second data buses 20 and 22 respectively, from the memory arrays (12, 16, 14, and 18 respectively).

Finally, each of the first, second, third and fourth memory arrays (12, 16, 14, and 18 respectively) has an associated control circuit (52, 56, 54, and 58 respectively) which includes registers for storing control signals. The control circuit 52, 56, 54 and 58 supplies he signals to its respective memory arrays (12, 16, 14 and 18) to assert an enable control signal, or the read signal, or the erase/program signal (for the flash memory arrays 12 and 16) or the write signals for the SRAM memory arrays 14 and 18.

Each address latch (32, 34, 36 or 38) and data latch (42, 44, 46, or 48) and control circuit (52, 54, 56 and 58) is connected to a control bus 30.

The memory circuit 10 also comprises a main control decoder sequencer 60, which is connected to the environment external to the integrated memory circuit 10. The main control decoder sequencer 60 interfaces with an address and data buses, a chip enable, write enable and output enable. In addition, the sequencer 60 causes a signal to be placed on the ready or busy output pin (RDY/BY#). Finally, although not necessary to the invention, the sequencer 60 can receive a separate enable signal for each of the memory arrays 12, 14, 16, and 18. In FIG. 1, this is designated as F1E (for flash bank 1 enable) for the first memory array 12. F2E is the enable signal for the second memory array 16. The S1E signal is for the third memory array 14 enable signal. The S2E is the fourth memory array 18 enable signal. The sequencer 60 is connected to the first and the second address buses 24 and 26 and to the first and second data buses 20 and 22. In addition, the memory circuit 10 comprises an IMA engine decoder sequencer 70 which is connected to the main decoder sequencer 60 and is also connected to the control bus 30 which supplies the control signals to the address latch, data latch and the control circuit associated with each of the memory arrays 12, 14, 16 and 18.

There are many modes of operation possible for the memory circuit 10 of the present invention.

In a first mode of operation, the memory circuit 10 can receive address signals external to the memory circuit 10 and retrieve the data signals from the address location specified by the address signal. The address space for the various memory arrays 12, 14, 16, and 18 do not overlap and thus each address signal request would go to an address in the first, second, third or fourth memory arrays 12, 16, 14, and 18, respectively.

In a second mode of operation, the first flash memory array 12 is associated with the first SRAM memory array 14 and the second flash memory array 16 is associated with the second SRAM array 18. Address signals and data signals external to the memory circuit 10 can be supplied to the memory circuit 10 along the address bus and the data bus to the main sequencer 60. This can be used to write (or program for the flash memory array) or read from a particular flash memory array 12 or 16 or the associated SRAM array 14 or 18. In addition, if the address or data signals supplied to the memory circuit 10 is a particular address or data signals, as in the format for Software Data Protection, a standard which is well known in the art, the main sequencer 60 interprets the sequence of address and data signals supplied thereto as being a command to transfer data between one particular flash memory array and its associated SRAM array. Thus, the following are examples of the type of transfer commands that the main control decoder sequencer 60 interprets based upon the sequence of address and data signals supplied to the circuit 10.

Byte mode (FL->SR) (5555/AA,2AAA/55,5555/BFS, FLA,SRA)

Byte mode (SR->FL) (5555/AA,2AAA/55,5555/BSR, SRA,FLA)

Sector mode (FL->SR) (5555/AA,2AAA/55,5555/SFS, FLA,SRA)

Sector mode (SR->FL) (5555/AA,2AAA/55,5555/SSR, SRA,FLA)

Block mode (FL->SR) (5555/AA,2AAA/55,5555/LFS, FLA,SRA)

Block mode (SR->FL) (5555/AA,2AAA/55,5555/LSR, SRA,FLA)

Chip mode (FL->SR) (5555/AA,2AAA/55,5555/CFS, FLA,SRA)

Chip mode (SR->FL) (5555/AA,2AAA/55,5555/CSR, SRA,FLA)

When such sequence of address and data buses is recognized by the main control sequencer 60 as commands to transfer data between, e.g. first flash array 12, and the first SRAM 14, the second address bus 26 and second data bus 22 is used for that purpose. Thus, for example, if one of the sequence of the address and data buses is recognized as the transfer of data from the flash memory array 12 to the SRAM array 14, the address at which the data from the flash memory array 12 is to be retrieved is supplied along the second address bus 26 and is then stored in the flash latch 32. The IMA decoder sequencer 70 will have been instructed to initiate the control signals to set the flash latch 32 to retrieve the signals from the address bus 26 and to supply those address signals to the address port of the flash array 12. The data signals from that particular address from the flash memory array 12 is then supplied from the data port and is stored in the flash latch 42 and is then supplied to the data bus 22. Those address signals and data signals are then supplied to the SRAM latch 34 and the SRAM data latch 44 of the corresponding SRAM memory array 14. The signals are then supplied into the SRAM memory array 14 for storage therewith. During this operation, the first address bus 24 and the first data bus 20 are free to receive signals from the main control decoder sequencer 60. Thus, in this manner, data from the second flash memory array 16 or from the second SRAM array 18 can be retrieved or can be written into and supplied along the first address and first data buses 24 and 20 respectively. In this manner, simultaneously, while data transfer occurs between one flash memory array e.g. 12 and its associated SRAM memory array e.g. 14, reading or writing from the other either flash memory array 16 or SRAM array 18 can occur.

In a third mode of operation, the memory circuit 10 operates similar to the second mode of operation. Similar to the second mode of operation, a Modified Software Data Protection command based upon a particular sequence of address signals and data signals external to the memory circuit 10 supplied to the main control sequencer 60 is interpreted as a command for either the first flash memory array 12 or the second flash memory array 16 to be erased or programmed. Because erase or programming of a flash memory array is a relatively "lengthy" operation, the command causes the address and data signals to be supplied along the second address and second data buses 26 and 22 respectively to the chosen flash memory array. The other flash memory array or its associated SRAM array can then be available for reading or writing.

There are a number of advantages of the memory circuit 10 of the present invention.

First, because each memory array 12, 14, 16, and 18 still has an enable port, the memory array can be "turned on" or "turned off". Thus, each array can be separately selected through the enable port without the need for a separate enable port directly connected to the main control decoder sequencer 60. In other words, through the use of again the Modified Software Data Protection scheme, particular sequences of address and data signals can be interpreted as a command to enable or disable particular memory arrays. In this manner, even the addressable space of the memory arrays 12, 14, 16, and 18, can overlap.

Further, in a preferred embodiment, the address space for the modified software data protection scheme in which particular address signals can be directed to locations that are outside of the SRAM array 14 or 18 but inside of the flash array 12 or 16. The default address selection after power up is that the address location is to within the flash array 12 or 16.

Figure 2:
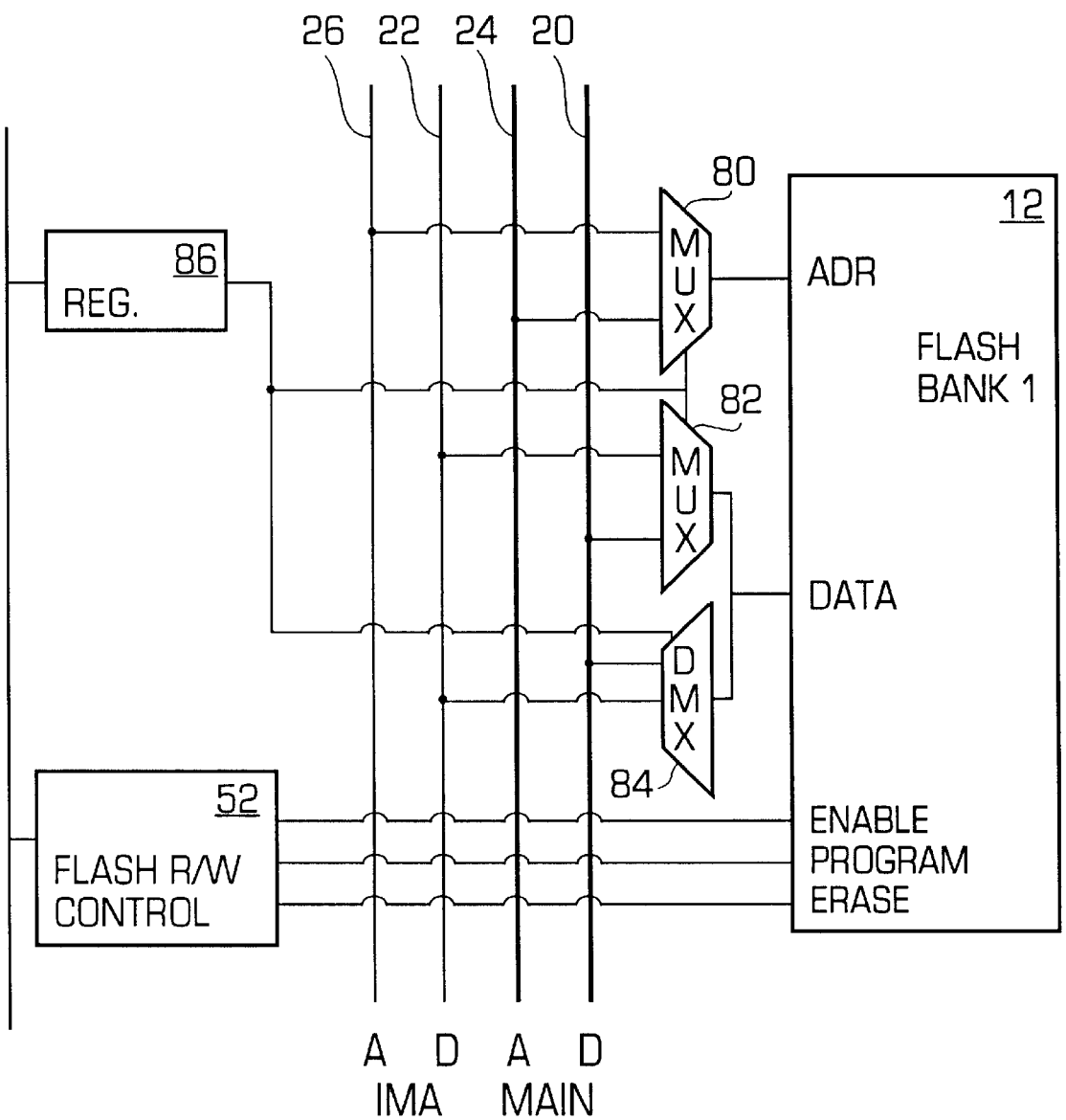
FIG. 2 is a schematic block level diagram of a portion of another embodiment of the memory circuit of the present invention showing a different access circuit for connecting a memory array to the first and second address buses and the first and second data buses.

Referring to FIG. 2, there is shown another embodiment of the circuitry which permits address and data from each of the flash memory arrays 12 and 16 or the SRAM memory arrays 14 and 18 to access the address buses 24 and 26 or the data buses 20 and 22. In the embodiment shown in FIG. 2, a first multiplexer 80 receives as input thereof signals from the first and second address buses 24 and 26 and produces as an output signal which is supplied to the address port of the memory array (12, 14, 16, or 18). Since address signals are only received by the memory array, only a single multiplexer, first multiplexer 80, is provided. The circuit also comprises a second multiplexer 82 which receives as its inputs first and second data buses 20 and 22. The output of the second multiplexer 82 is connected to the data port of the memory array (12, 14, 16, or 18). Finally, the data signals from the memory array (12, 14, 16, or 18) is provided to a demuliplexer 84 and is then connected to the first or second data buses 20 and 22. Each of the first and second multiplexers 80 and 82 and the demultiplexer 84 is controlled by the state of the register 86 which is connected to the control bus 30.

The advantage of the embodiment shown in FIG. 2 is that the address and data signals from the first and second address buses 24 and 26 and from the first and second data buses 20 and 22 can be supplied directly to the memory array 12, 14, 16, 18 without being first "latched" or stored in the address latches 32, 34, 26 or 38 or the data being stored in the data latches 42, 44, 46 or 48. The use of the multiplexer results in faster accessing of address and data.

What is claimed is:

1. An integrated memory circuit comprising:
   a first array of non-volatile memory cells;
   a second array of volatile memory cells;
   a first address bus for carrying a first address signal, internal to said circuit, said first address bus, coupled to receive an externally supplied address signal;
   a second address bus for carrying a second address signal, internal to said circuit;
   a first data bus for carrying a first data signal, internal to said circuit, said first data bus, coupled to receive an externally supplied data signal;
   a second data bus for carrying a second data signal, internal to said circuit;
   each of said first and second arrays of memory cells further comprising an access circuit for connecting said array of memory cells to said first address bus or said second address bus, and for connecting said array of memory cells to said first data bus or said second data bus; and
   a control circuit responsive to said externally supplied data signal and to said externally supplied address signal for transferring data from said first array of non-volatile memory cells to said second array of volatile memory cells along said second data bus.

2. The memory circuit of claim 1 wherein said control circuit is responsive to a plurality of said externally supplied data signals and a plurality of said externally supplied address signals for causing the reading or writing of said second array of volatile memory cells while simultaneously said first array of non-volatile memory cells is being programmed or erased.

3. The memory circuit of claim 1 further comprising:
   a third array of non-volatile memory cells; and
   wherein said control circuit is responsive to a plurality of said externally supplied data signals and a plurality of said externally supplied address signals for causing a transfer of data between said first array of non-volatile memory cells and said second array of volatile memory cells, while simultaneously, accessing said third array of non-volatile memory cells.

4. The memory circuit of claim 2 or 3 wherein said array of volatile memory cells is an array of SRAM cells.

5. The memory circuit of claim 2 wherein said second array of SRAM cells is a dual port memory array.

6. The memory circuit of claim 3 wherein said control circuit controls the transfer of data signals between said first and second arrays of memory cells via said second data bus, while simultaneously controlling the transfer of data signals to or from said third array of memory cells via said first data bus.

7. The memory circuit of claims 6 wherein said control circuit performs its controlling function in response to a plurality of address signals and a plurality of data signals supplied external to said memory circuit.

8. The memory circuit of claim 7 further comprising;
   an access circuit associated with each of said first, second and third memory arrays for controlling the connection of said first, second or third memory arrays to said first and second address buses, and to said first and second data buses.

9. The memory circuit of claim 8 wherein said access circuit further comprises:
   an address latch connected to said first address bus and to said second address bus to receive said first address signal and said second address signal and to select one of said first or second address signals;
   a data latch, connected to said first data bus and to said second data bus to receive said first data signal and said second data signal and to select one of said first or second data signals.

10. The memory circuit of claim 8 wherein said access circuit further comprises:
    an address multiplexer connected to said first address bus and to said second address bus to receive said first address signal and said second address signal and to select one of said first or second address signals;
    a data multiplexer, connected to said first data bus and to said second data bus to receive said first data signal and said second data signal and to select one of said first or second data signals.

11. The memory circuit of claim 9 further comprising:
    a control bus connecting said control circuit to said address latch and said data latch associated with each access circuit.

12. The memory circuit of claim 10 further comprising:
    a control bus connecting said control circuit to said address multiplexer and said data multiplexer associated with each access circuit.

* * * * *